United States Patent [19]

Kaifu et al.

[11] Patent Number: 4,953,000

[45] Date of Patent: Aug. 28, 1990

[54] SEMICONDUCTOR DEVICE

[75] Inventors: Noriyuki Kaifu, Hiratsuka; Masayoshi Murata; Osamu Hamamoto, both of Atsugi; Katsumi Komiyama, Isehara, all of Japan

[73] Assignee: Canon Kabushiki Kaisha, Tokyo, Japan

[21] Appl. No.: 270,068

[22] Filed: Nov. 14, 1988

[30] Foreign Application Priority Data

Nov. 14, 1987 [JP] Japan .................. 62-288200

[51] Int. Cl.[5] ............................ H01J 40/14
[52] U.S. Cl. ...................... 357/71; 357/15; 357/30; 357/47; 357/58
[58] Field of Search ............ 357/47, 71, 58, 15, 357/30 C, 30 D, 30 G, 30 H, 30 L, 30 R

[56] References Cited

U.S. PATENT DOCUMENTS 4,650,984 3/1987 Furushima et al. ............ 250/211 R
4,845,355 7/1989 Nakagawa et al. ............. 250/211 J

FOREIGN PATENT DOCUMENTS 59-63753 4/1984 Japan ................................ 357/47

OTHER PUBLICATIONS

S. M. Sze, Physics of Semiconductor Dev'l., pp. 363, 827.

Primary Examiner—Andrew J. James
Assistant Examiner—David L. Soltz
Attorney, Agent, or Firm—Fitzpatrick, Cella, Harper & Scinto

[57] ABSTRACT

A semiconductor device comprising a pair of first and second opposing conductors and a lamination of a semiconductor layer and an insulating layer held between, and joined together, the first and second conductors, respectively. The average potential of the second conductor joined to the insulating layer relative to the average potential of the first conductor joined to the semiconductor layer is set so as to have such a direction that the supply of carriers from the first conductor to the semiconductor layer is prevented.

22 Claims, 5 Drawing Sheets

SEMICONDUCTOR DEVICE

BACKGROUND OF THE INVENTION

1. Field of the Invention

The present invention relates to semiconductor devices such as photosensors, and more particularly to improvements to the insulation between conductors laminated through a semiconductor layer in a semiconductor device.

2. Related Background Art

Recently, a technique has been developed by which a plurality of thin film semiconductor elements are formed on a substrate in a semiconductor device for use in an IC, an LSI, a liquid crystal device, a photosensor or the like. It requires a plurality of intersections of leads for wiring among the respective elements.

Especially, it is necessary to form a total of 10,000 or more thin film transistors (TFTs) on the same substrate in a liquid crystal display. Also, it is necessary to form a total of 1,728 photosensor elements, 8 photosensor elements/1 mm and a like number of TFTs corresponding to the respective photosensor elements on the same substrate in an A-4 size document reading equimagnification line sensor.

Therefore, much more intersections are required for wiring among the elements. When a wiring matrix is employed to miniaturize a device which reduces the number of elements, for example TFT, the number of intersections are 10,000 or more.

Such intersections are preferably insulated by using semiconductor layers and insulating layers which constitute parts of elements without providing special purpose insulating layers in order to simplify the intersection forming process and reduce the cost.

Figure 1A:
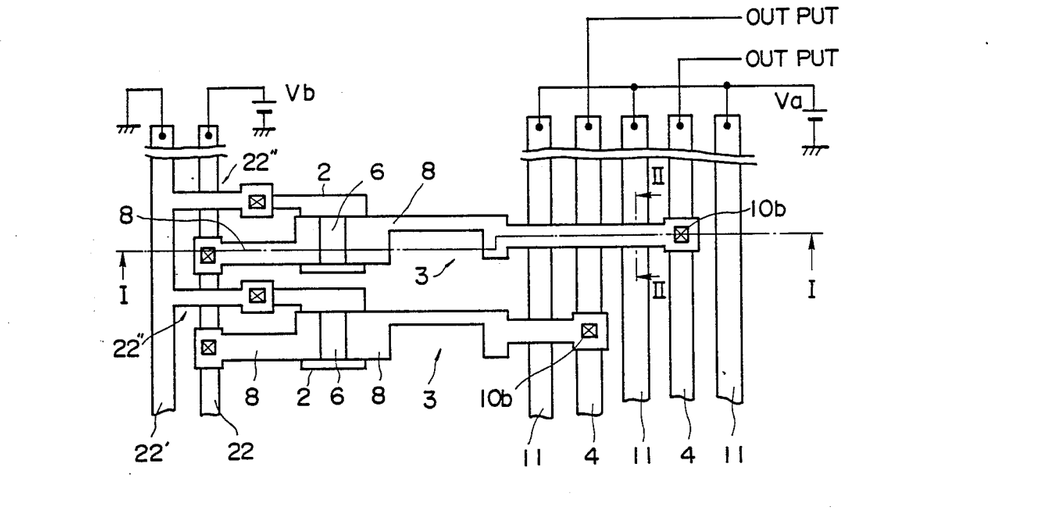
FIG. 1(A) is a schematic plan view of one example of a semiconductor device.
Figure 1B:
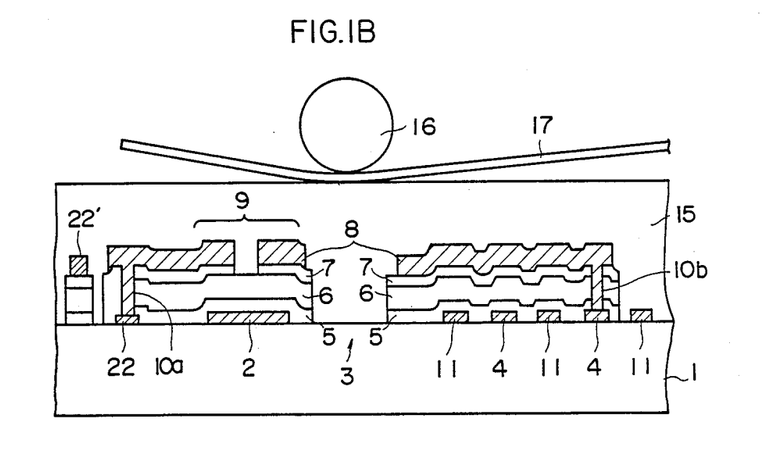
FIG. 1(B) is a schematic cross-section view taken along the line I—I of FIG. 1(A)

FIG. 1(A) is a schematic plan view of one example of a semiconductor device and FIG. 1(B) is a schematic cross-section view taken along the line I—I in FIG. 1(A). For the sake of illustration, other attached portions are also shown.

The present invention will be described illustratively on the basis of a device shown in FIG. 1 because the present invention is preferred in a close-contact type photoelectric conversion apparatus which uses a photoelectric type line sensor in which electrons are used as carriers. Herein, a signal reading system employs a wiring matrix. Formed on a substrate 1 are common wiring leads 4 and shielded leads 11, as shown, on which an insulating layer 5, an intrinsic semiconductor layer (hereinafter referred to as "i-layer") 6 and an n+-layer 7 for ohmic contact are superposed. Individual electrode leads 8 are formed extending from the photosensors 9 and connected through contact holes 10b to the common leads 4.

In such wiring matrix, a constant potential is applied to each shield lead 11 by a power source Va. This is intended to prevent crosstalk caused by capacitive coupling among the common wiring leads 4.

Each common lead 4 is connected to a current-to-voltage converter (not shown) including an operational amplifier which converts a photoelectric current from the photosensor 9 to a voltage which is then output from the device. Each common lead 4 in this arrangement is at a reference voltage comprising a ground potential.

However, the semiconductor device has the following problems which the inventors found as a result of many experiments.

Figure 2:
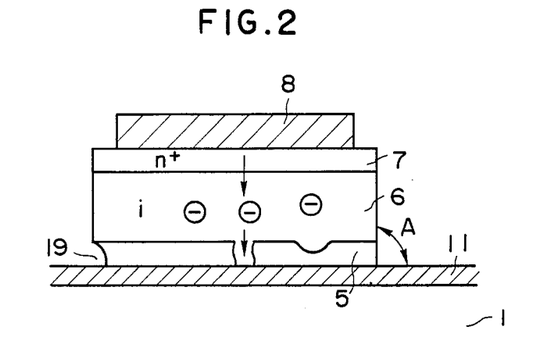
FIG. 2 is a schematic cross-section view of a shielded lead 11 and its vicinity of FIG. 1(B) shown the enclosed scale.

FIG. 2 is a schematic cross-section view taken along the line II—II in FIG. 1(A).

As mentioned above, each shielded leads 11 is supplied with a positive voltage from the power source Va, and each individual electrode lead 8 is connected to the corresponding common lead 4, so that the reference voltage is substantially at a ground level. In FIG. 2, each shielded lead 11 at higher potential compared to the corresponding individual electrode lead 8.

Under such conditions, electrons are supplied from each individual lead 8 through n+-layer 7 to i-layer 6 and hence to the insulating layer 5 since the leads 8 are low in potential compared to the shielded leads 11.

It has been found that if the insulating layer 5 is defective or locally thinner than its remaining portion due to variations in the manufacturing process, an electric field is intensified at that portion thereby probably causing dielectric breakdown. The electric field formed across the space shown by the double headed arrow A is also intensified. If impurity ions or moisture are present on the side of the insulating layer 5 and the surface of leads 11, the lower layer leads 11 will be with a high probability melted and disconnected by electrolysis.

Since insulation depends on the thickness of the insulating layer 5, overetching, for example, shown by 19, caused in the manufacturing process, if any, would be likely to lower the electrically insulating strength, yielding and reliability.

Such a problem would occur not only at the intersections of shielded leads 11 and the individual electrode leads 8, but also at intersections 22" of leads 22 to which a positive voltage is applied by a power source Vb and leads 22' which are grounded (see FIG. 1(A)).

SUMMARY OF THE INVENTION

It is an object of the present invention to provide a semiconductor device comprising a pair of first and second opposing conductors and a lamination of a semiconductor layer and an insulating layer held between, and joined to, the first and second conductors, respectively, the average potential of the second conductor joined to the insulating layer relative to the average potential of the first conductor joined to the semiconductor layer being set so as to have such a direction that the supply of carriers from the first conductor to the semiconductor layer is prevented.

It is another object of the present invention to provide a semiconductor device in which no strong electric field is produced in a possible locally thinner portion of the insulating layer to greatly improve the insulation between, and the durability of, both the conductors to thereby have high reliability compared to the conventional semiconductor device since both the insulating layer and the semiconductor layer contribute to insulation and hence the effective insulating layer becomes thickened substantially by setting the average potential of the first and second conductor potentials, as mentioned above.

DETAILED DESCRIPTION OF THE PREFERRED EMBODIMENT

One preferred embodiment of the present invention is a semiconductor device which has a structure which includes two conductive layers, each comprising a lead, a lamination of a insulating layer and a semiconductor layer joined between the two conductive layers with the minimum requirement that the average potential applied to the respective two conductive layers have such a direction that the potential acts so as to prevent the supply of carriers to at least one of the semiconductor layers.

Figure 3A:
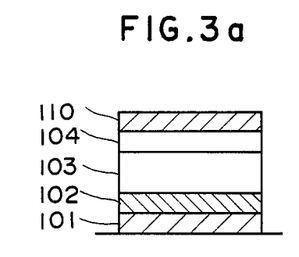
FIGS. 3a and 3b each are a schematic of a preferred embodiment of the present invention.

For example, as shown in FIG. 3a, if a semiconductor device includes a structure comprising a lamination of a first lead 101 as a conductive layer, an insulating layer 102, an i-type semiconductor layer 103, an $n^+$-type semiconductor layer 104, and a second lead 110 as a conductive layer, the minimum requirement is that the first lead 101 be set at a potential low compared to the second lead 110. If the semiconductor layer 104 is replaced with one of $p^+$-type, the first lead 101 should only be set low in potential compared to the second lead 110.

Figure 3B:
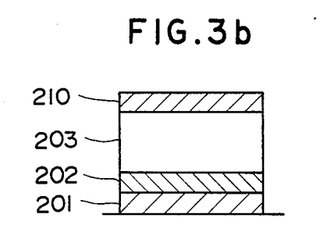

As shown in FIG. 3b, in a semiconductor device which includes a first lead 201, an insulating layer 202, an i-type semiconductor layer 203, and a second lead 210, the first lead 201 should only be set high in potential compared to the second lead 210 if the second lead 210 is made of Al or Cr and forms a Schottky barrier against the i-layer 203.

As just described above, the average potentials of the respective conductive layers should be appropriately selected depending on the structure, conductive type and carrier densities, etc., of the semiconductor layer.

EXAMPLE

One preferred embodiment of the present invention now be described in detail with reference to the drawings.

Figure 4A:
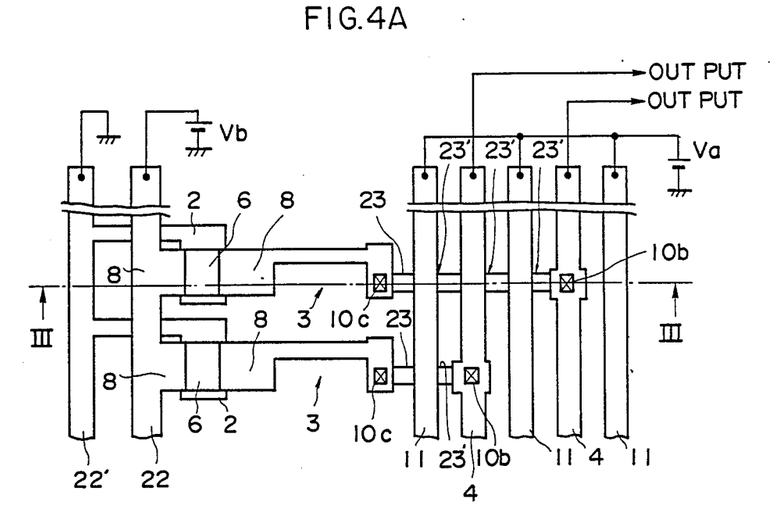
FIG. 4(A) is a schematic plan view of one example of a semiconductor device according to the present invention.
Figure 4B:
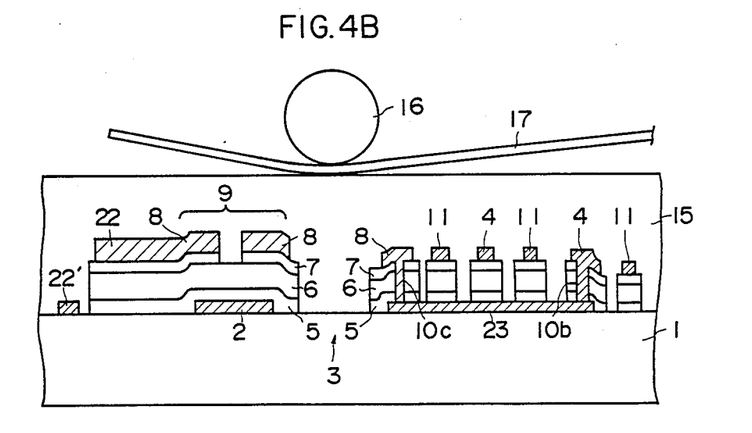
FIG. 4(B) is a cross-section view taken along the line III—III of FIG. 4(A)

FIG. 4(A) is a schematic plan view of one embodiment of a semiconductor device according to the present invention. FIG. 4(B) is a schematic cross-section view taken along the line III—III of FIG. 4(A).

The particular embodiment is a close contact type photoelectric conversion device which employs a line sensor which comprises a plurality of photoelectric type sensors arranged vertically, as viewed in FIG. 4(A), which uses electrons as the carriers. For simplifying purposes, FIG. 4(A) shows only a 2-bit portion of the device.

PREPARATION OF SAMPLE 1

As shown in FIGS. 4(A) and 4(B), a light screening layer 2 having an illuminating window 3, a lead 22' which fixes the screening layer 2 to a ground potential, and individual matrix electrode leads 23 were formed on a cleaned glass plate comprising a transparent insulating substrate 1 by depositing Al/Cr 0.1 μm thick by vacuum deposition, forming a resist pattern by photolithography, and then by wet etching. A transparent insulating layer 5 made of silicon nitride was formed 0.3 μm thick on the layer 2 at RF glow discharge using $SiH_4$ and $NH_3$ gases as source gases by plasma CVD. Subsequently, an i-layer 6 of a-Si, etc., as a photoconductive layer was formed 1 μm thick, using $SiH_4$ gas as the source gas.

An $n^+$-layer 7 for ohmic contact was then superposed 0.1 μm thick using $SiH_4$ and $PH_3$ gases as the film material. A resist pattern was formed by photolithography, reactive ion etching was performed as dry etching using $CF_4$ gas to partially remove $n^+$-layer 7, i-layer 6 and insulating layer 5 to thereby form contact holes 10b and 10c. Thereafter, aluminum was deposited so as to be 0.1 μm thick by vacuum deposition, a resist pattern was formed by photolithography, and wet etching was performed to remove aluminum partially. The $n^+$-layer was removed by dry etching to form leads 4, 11, 8, 22, etc., on the upper layer side.

Further, the respective devices were separated independent of each other by dry etching similar to that mentioned above.

Finally, a transparent protective film 15 of polyimide and epoxy resins was formed to finish the device.

In this way, the photoelectric conversion device according to the present invention was fabricated. This device includes electrodes 8 as both terminals of each of the photosensors 9, lead 22 for supply of a positive potential from the power source Vb to the photosensors 9, common matrix leads 4 and shielded leads 11. A positive potential is applied to the shielded leads 11 from the power source Va in order to prevent possible crosstalk.

The individual electrode leads 23 from the photosensors 9 are connected to the corresponding common leads 4 through contact hole 10b to form matrix leads.

The insulating layer 5, i-layer 6 and $n^+$-layer 7 between each common lead 4 and the corresponding shielded lead 11 are etching away.

PREPARATION OF SAMPLE 2

A sample 2 was prepared using a process similar to that used to form the above mentioned sample 1. The sample 2 is a photoelectric conversion device such as that shown in FIG. 1 and differs only from the sample 1 in that the common matrix leads 4, shielded leads 11, individual electrode leads 23 and potential supply leads 22 and 22' are inverted upside down in arrangement compared to the sample 1. The respective layers were formed by using quite the same film-forming and etching processes as those used for forming sample 1.

The operation of a close contact type image sensor will now be described briefly with reference to FIG. 4(B).

A document 17 to be read is put by a roller 16, etc., in close contact with the sensor. Light from a light source (not shown) is irradiated through the illuminating window 3 onto the document 17. The reflected light is entered into the photosensor 9 in which the resistance of the i-layer 6 is changed in accordance with the intensity of the incident light, so that information on the document 17 is converted to an electrical signal.

The output signal from the photosensor 9 appears through the individual lead 23 on the common lead 4 and output out of the device through a current-to-voltage conversion circuit (not shown).

EXPERIMENT I

The following experiment was performed on a plurality of samples 1 and a plurality of samples 2 thus prepared, as an example that the voltage applied to the shield wiring is maintained constant and the positions of shield wiring and separate electrode wiring are different.

First, voltages of 5 V and 3 V were applied to the shielded leads 11 and the individual electrode leads 23 of samples 1 and 2, respectively, at an environmental temperature of 80° C. and an environmental humidity of 85%. Under such condition, the photoelectric conversion was performed to observe the output signals while observing the intersections 23'.

As a result, corrosion appeared through all the samples 2 and the output signals became disturbed 150 hours after the experiment started. However, a first disturbance in the output signals due to corrosion of samples 1 was not found until a lapse of 500 hours.

EXPERIMENT II

As an example that the positions of the shield electrode and the separate electrode are identical, another experiment was performed using a plurality of such samples 2. First, a voltage of 3 V was applied to the individual electrode leads 23 of all the samples and voltages of 0, 3, 5 V were applied to the corresponding shielded leads 11 of all the respective samples at an environmental temperature of 80° C. and an environmental humidity of 85%. Under such conditions, the intersections 23' were observed while the output signals were also observed. The results are shown in Table below:

TABLE

| Samples | Voltages to shielded leads (V) | Time elaped (h) | | | | | | Time lapsed (h) | | | |
|---|---|---|---|---|---|---|---|---|---|---|---|
| | | 24 | 48 | 60 | 72 | 84 | 96 | 120 | 144 | 156 | 180 |
| Sample 2-0 | 0 | O | O | O | O | Δ | Δ | Δ | Δ | X | X |
| Sample 2-1 | 3 | O | O | O | O | O | O | O | O | O | O |
| Sample 2-2 | 5 | O | O | O | O | O | O | O | O | O | O |

| Samples | Votages to shielded leads (V) | Time laspsed (h) | | | | | | | |
|---|---|---|---|---|---|---|---|---|---|
| | | 216 | 288 | 312 | 336 | 384 | 456 | 480 | 504 |
| Sample 2-0 | 0 | X | X | X | X | X | X | X | X |
| Sample 2-1 | 3 | O | O | O | O | O | O | O | Δ |
| Sample 2-2 | 5 | O | O | O | O | O | O | O | O | where
O means that all the samples are normal,
Δ means that part of the samples is corroded and the corresponding output is abnormal, and
X means that all the samples are corroded and all the corresponding outputs are abnormal.
The samples 2-1 and 2-2 of the present invention present preferable results.

EXPERIMENT III

A further experiment was performed using a plurality of such samples 2. The directions of the potentials applied to the individual electrode leads 23 and shielded leads 11 were reversed to perform a dielectric strength test. As a result, the dielectric strength of the samples was 30 V when the potential applied to the individual electrode leads 23 was higher those applied to the shielded leads 11.

The dielectric strength of the samples was 250 V when the potential of the individual electrodes 23 was lower than that of the shielded leads 11.

Figure 5:
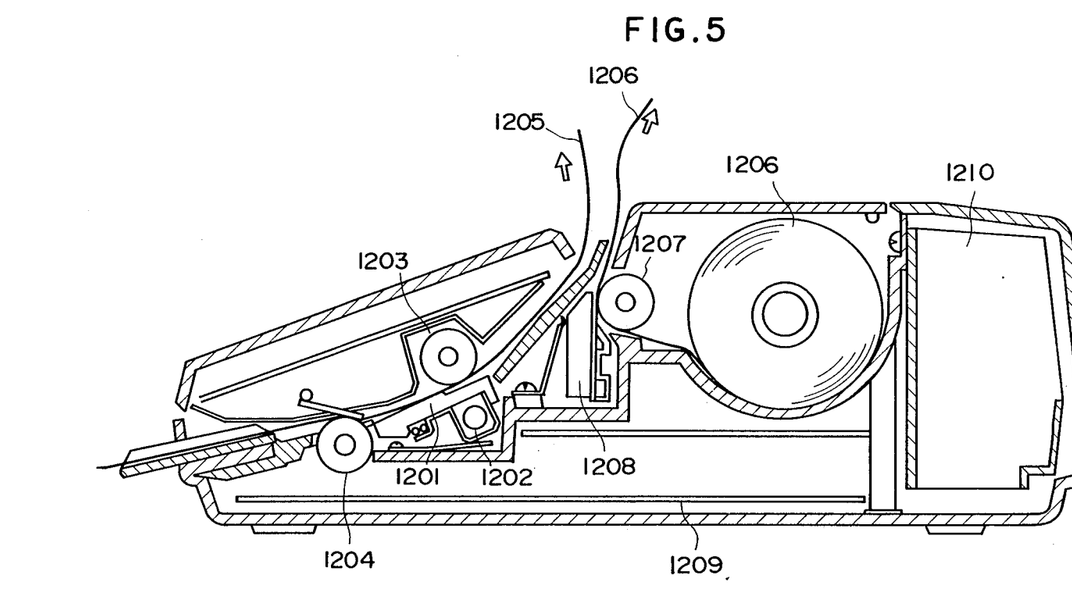
FIG. 5 is a schematic of a facsimile device employing the present embodiment.

FIG. 5 is a schematic of a facsimile device using a photoelectric conversion device according to the particular embodiment.

In FIG. 5, at document transmission, a document 1205 is pressed by a platen roller 1203 against the close contact type image sensor 1201 as a photoelectric conversion device and moved in the direction of the arrow by the platen roller 1203 and a feed roller 1204. The document face is illumined by a xenon lamp 1202 which is a light source and the reflection is entered into the sensor 1201 where the light is converted to an electrical signal corresponding to the image information on the document and then transmitted.

At reception, recording paper 1206 is carried by the platen roller 207 and an image corresponding to the received signal is reproduced by a thermal head 1208 on recording paper.

The whole device is controlled by a controller (not shown) on a system control baseplate 1209 and the respective drive systems and circuits are fed with power from a power source 1210.

As an image communication was performed using a photoelectric conversion device according to the present invention mounted on the above facsimile device, the communicated image was maintained satisfactorily even when the facsimile device was used through a long time.

Figure 6:
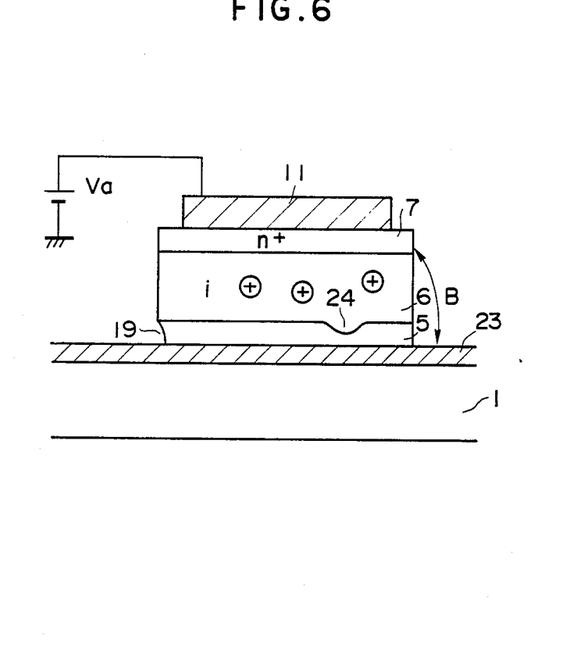
FIG. 6 is a cross-section view taken along the line II—II in FIG. 1(A).

FIG. 6 is a schematic cross-section on enlarged scale of a shielded lead 11 and its vicinity in FIG. 4(B).

According to the particular embodiment, as mentioned above, a positive voltage is applied to the shielded lead 11 from the power source Va. The individual electrode lead 23 which passes the output signal from the corresponding sensor therethrough has a reference potential set at ground level. Therefore, the individual electrode lead 23 has an average potential low compared to the shielded lead 11.

Therefore, the i-layer 6 is in an electron-depleted state so that even if holes are produced, they cannot move between the $n^+$-layer 7 and i-layer 6 and thus the i-layer 6 functions as an insulator. The thickness of the effective insulating layer is equal to the total thickness of the insulating layer 5 and i-layer 6, so that the insulation and durability are greatly improved compared to the prior art device. As an example, since the i-layer 6 is also an insulator even if the insulating layer 5 is overetched or locally thinned in manufacture, there is no decrease in the dielectric strength in the overetched portion 19 and thus dielectric breakdown due to concentration of the electric field established across the thinned portion 24 is prevented.

Since the effective insulating layer is thickened, the electric field established across the space shown by the double-headed arrow B in FIG. 6 is low compared to the conventional device. As a result, electrolysis at the sides of the insulating layer 5 and i-layer 6 are prevented from acceleration, thereby preventing fusing away of the lead 23.

The respective intersections of the leads 22 and 22' in FIG. 4(A) have a similar structure, so that the insulation and durability between both the leads are improved. Therefore, even if there are many intersections throughout the whole device as in this photoelectric conversion device, high reliability is achieved according to the present invention.

In the particular embodiment, the structure of FIG. 4 is employed, but the present invention is not limited to it. As mentioned above, for example, even with the structure including the intersections of the shielded leads 11 and individual electrode leads 8 shown in FIG. 1, if the shielded leads 11 are set at an average potential low compared to the individual electrode leads 8 when the direction of the power source Va can be reversed in the circuit structure, the i-layer 6 is put in an electron (carrier)-depleted state. Therefore, even if holes are produced, they cannot move between the n+-layer 7 and the i-layer 6, so that the i-layer 6 functions as an insulator to thereby provide effect similar to that provided by the particular embodiment.

Also as mentioned above, if the ohmic contact layer 7 is formed of a p+-layer, and using a photosensor in which holes are used as the carriers is used, and when the potential relationship between the opposing electrodes of the lead intersection are the same as that of the shielded leads 11 and the individual electrode leads 8 shown in FIG. 1, the i-layer 6 is put in a hole (carrier)-depleted state, so that even if electrons are produced, they cannot move between the p+-layer and the i-layer, so that the i-layer 6 functions as an insulator to thereby provide effect similar to that provided by the particular embodiment.

As mentioned above, if a material which forms a Schottky barrier the i-layer 6 and something against at least one of electron and hole carriers is used as an electrode, the n+-layer and p+-layer are not needed, and if the respective average potentials of the opposite electrodes are set to have a direction in which the supply of carriers to the i-layer is prevented, effect similar to that provided by the particular embodiment is provided.

While in the particular embodiment a structure including the i-layer is employed, the present invention is not limited to it. In summary, if a structure is employed in which the average potential of the opposite electrodes have for any semiconductor layer such a direction that supply of carriers to part or all of the semiconductor layer is prevented, the layer in which the supply of at least the carriers is prevented functions as an insulator to thereby provide effect similar to that provided by the particular embodiment. The object of the present invention is achieved.

While in the particular embodiment the direct current voltage is applied to the shielded leads 11, the present invention is not limited to it. Even if a pulse-like voltage is applied to the upper and lower layer leads of a similar laminated structure, effect similar to that provided by the particular embodiment is obtained if the average potentials are set as mentioned above.

While the present invention is preferably applied to a close contact type photoelectric conversion device such as that shown as the particular embodiments, it is not limited to the embodiments. The present invention is generally applicable to semiconductor devices having a multi-layered structure which needs an insulated area.

Thus, by applying the present invention to information processing devices such as facsimile devices, inexpensive information processing devices which are improved in yielding and reliability are realized.

As mentioned above in detail, in a semiconductor device according to the present invention, the respective average potentials of the first and second conductors are set in a direction in which the supply of the carriers from the first conductor to the semiconductor layer is prevented, so that the insulating layer as well as the semiconductor layer contributes to insulation and therefore the thickness of the effective insulating layer is substantially increased.

Therefore, even if the insulating layer is locally thinned, no strong electric field is established there, the insulation between, and the durability of, both the conductors are greatly improved compared to the prior art device and the reliability and durability of the whole device are improved.

We claim:

1. A semiconductor device comprising:
   a semiconductor element; and
   a wiring portion including an intersection of a first and a second lead,
   wherein said intersection comprises a semiconductor layer and a insulating layer which are laminated between said first and second leads, and wherein an average potential of said second lead joined to said insulating layer relative to an average potential of said first lead joined to said semiconductor layer has a direction such that a supply of carriers from said first lead to said semiconductor layer is prevented.

2. A semiconductor device according to claim 1, wherein said semiconductor layer includes an i-layer and an n+-layer, and wherein said first lead has a higher average potential than that of said second lead.

3. A semiconductor device according to claim 1, wherein said first lead forms a Schottky barrier against said semiconductor layer.

4. A semiconductor device according to claim 1, wherein said semiconductor layer is made of an amorphous silicon hydride.

5. A semiconductor device according to claim 1, wherein said semiconductor element comprises a photoelectric conversion element.

6. A semiconductor device according to claim 1, wherein said semiconductor device comprises a contact type sensor.

7. A semiconductor device according to claim 1, wherein said semiconductor device comprises a liquid crystal display.

8. A semiconductor device according to claim 1, wherein said semiconductor device comprises an integrated circuit.

9. A semiconductor device comprising:
   a substrate;
   a plurality of semiconductor elements disposed on said substrate, each of said semiconductor elements including a respective photoelectric conversion element having a semiconductor region; and
a wiring portion disposed on said substrate and further comprising:
a plurality of first leads each electrically connected to a respective one of said semiconductor elements,
a plurality of second leads each electrically connected to at least one of said plurality of first lead,
a plurality of third leads, provided among said second leads, and
an insulating region comprising a lamination of a semiconductor layer and an insulating layer, and disposed between said first and said third leads at intersections thereof,
wherein said third leads are maintained at a predetermined potential to prevent a supply of carriers to said semiconductor layer.

10. A semiconductor device according to claim 9, wherein each of said intersections includes a corresponding one of said first leads, said semiconductor layer being provided on that first lead through said insulating layer, and a corresponding one of said second or third leads provided on the semiconductor layer through an n+-layer, and wherein an average potential of individual said first lead is lower than that of said second or third lead.

11. A semiconductor device according to claim 9, wherein each of said intersections includes a corresponding one of said first leads, the semiconductor layer being provided on that first lead through said insulating layer, and a corresponding one of said second or third leads provided on the semiconductor layer through a p+-layer, and wherein an average potential of said first lead is higher than that of said second or third lead.

12. A semiconductor device according to claim 9, wherein each of said intersections includes a corresponding one of said second or said third leads, said semiconductor layer being provided on said second of said third lead through said insulating layer, and a corresponding one of said first leads provided on said semiconductor layer through an n+-layer, and wherein an average potential of said first is higher than that of said second or third lead.

13. A semiconductor layer according to claim 9, wherein each of said intersections includes a corresponding one of said second or said third leads, said semiconductor layer provided on said second or said third lead through said insulating layer, and a corresponding one of said first leads provided on said semiconductor layer through a p+-layer, and wherein an average potential of said first lead is lower than that of said second or third lead.

14. A semiconductor layer according to claim 9, wherein said semiconductor layer is made of amorphous silicon hydride.

15. A semiconductor device according to claim 9, wherein said voltage source applies a direct current voltage.

16. A semiconductor device according to claim 9, wherein said voltage source applies a pulse voltage.

17. A semiconductor device according to claim 9, wherein the predetermined potential is obtained by applying a direct current voltage.

18. A semiconductor device according to claim 9, wherein the predetermined potential is obtained by applying a pulse voltage.

19. An apparatus comprising:
a light source; and
a semiconductor device further comprising:
a substrate,
a plurality of semiconductor elements disposed on said substrate, each of said semiconductor elements including a photoelectric conversion element having a semiconductor region,
a wiring portion on said substrate, further comprising:
a plurality of first leads each electrically connected to a respective one of said semiconductor elements,
a plurality of second leads each electrically connected to at least one of said plurality of first leads, and
a plurality of third leads, provided among said second leads, and
an insulating region comprising a lamination of a semiconductor layer and an insulating layer, and disposed between said first lead and said third lead of an intersection of a corresponding one of said first leads and a corresponding one of said third leads and a voltage source for supplying a predetermined voltage to said third leads,
wherein an average potential of each of said third leads relative to an average potential of its corresponding said first lead is set so as to have such a direction that supply of carriers to said semiconductor layer is prevented.

20. An apparatus according to claim 19, wherein said apparatus comprises a facsimile machine.

21. A semiconductor device comprising:
a substrate;
a plurality of photoelectric conversion elements disposed on said substrate, each of said conversion elements including a semiconductor layer for photoelectric conversion and a respective individual electrode electrically connected to said semiconductor layer;
a matrix of leads electrically connected to said photoelectric conversion elements; and
a plurality of leads provided among said matrix of leads and held at a predetermined potential,
wherein said respective individual electrodes and said plurality of leads have corresponding intersections, each of said intersections having said semiconductor layer and an insulating layer between a corresponding one of said individual electrodes and a corresponding one of said leads,
wherein said individual electrode is maintained at an average potential such that a supply of carriers to said semiconductor layer is prevented, and
wherein said semiconductor layer is provided on said individual electrode through said insulating layer and said lead is provided on said semiconductor layer through a p+-layer, an average potential of said individual electrode being higher than that of said corresponding lead.

22. A semiconductor device comprising:
a substrate;
a plurality of photoelectric conversion elements disposed on said substrate, each of said conversion elements including a semiconductor layer for photoelectric conversion and a respective individual electrode electrically connected to said semiconductor layer;

a matrix of leads electrically connected to said photoelectric conversion elements; and a plurality of leads provided among said matrix of leads and held at a predetermined potential, wherein said respective individual electrodes and said plurality of leads have corresponding intersections, each of said intersections having said semiconductor layer and an insulating layer between a corresponding one of such individual electrodes and a corresponding one of said leads, wherein said individual electrode is maintained at an average potential such that a supply of carriers to said semiconductor layer is prevented, and wherein said corresponding individual electrode is provided on said semiconductor layer through a $p^+$-layer, wherein an the average potential of each individual electrode is lower than that of corresponding said lead.

* * * * *